United States Patent [19]

Keister et al.

[11] 3,742,120

[45] June 26, 1973

[54] SINGLE LAYER SELF-DESTRUCT CIRCUIT PRODUCED BY CO-DEPOSITION OF TUNGSTIC OXIDE AND ALUMINUM

[75] Inventors: Frank Z. Keister, Culver City; Gary S. Smolker, Los Angeles, both of Calif.

[73] Assignee: The United States of America as represented by the Secretary of the Navy, Washington, D.C.

[22] Filed: Oct. 28, 1970

[21] Appl. No.: 90,204

[52] U.S. Cl................... 174/68.5, 29/626, 338/309, 307/202, 307/299

[51] Int. Cl........ H05k 1/04, H01c 7/00, F42c 13/00

[58] Field of Search.............. 317/80, 101 CE, 258; 174/68.5; 307/298, 202, 299, 303; 149/37

[56] References Cited

UNITED STATES PATENTS

| | | | |
|---|---|---|---|
| 3,394,218 | 7/1968 | Foudriat | 174/68.5 |
| 3,297,503 | 1/1967 | Hoffman et al. | 149/37 |
| 3,666,967 | 5/1971 | Keister et al. | 307/202 |
| 3,697,668 | 10/1972 | Campbell | 174/68.5 |

*Primary Examiner*—Benjamin A. Borchelt
*Assistant Examiner*—H. A. Birmiel
*Attorney*—R. S. Sciascia and P. S. Collingnon

[57] ABSTRACT

A single layer self-destruct thermite material of tungstic oxide and aluminum simultaneously vacuum deposited on a substrate underlying or overlying a thin film circuit separated therefrom by an electrical insulating thin film to cause thin film circuit destruction when the destruct film is ignited by electrical energy.

1 Claim, 2 Drawing Figures

INVENTORS
FRANK Z. KEISTER
GARY S. SMOLKER
BY
H. H. Losche
ATTORNEYS

SINGLE LAYER SELF-DESTRUCT CIRCUIT PRODUCED BY CO-DEPOSITION OF TUNGSTIC OXIDE AND ALUMINUM

BACKGROUND OF THE INVENTION

This invention relates to self-destruct anticompromise circuits and more particularly to vacuum deposited thin film combinations that are positioned over or under thin film circuits on a substrate to destroy the thin film circuit beyond use or recognition.

In prior known circuits of this type where it was desirable to destroy the circuit before it fell into enemy hands, an explosive, a flammable element, or an acid destructive device was placed in close proximity to the thin film circuit which was destroyed in part or damaged when the explosive, flammable element, or acid device was activated. It has been quite common to place a pyrotechnic package in close proximity to the circuit to be destroy but such devices only partially destroyed the circuit. The only known thin film integrated destructive device utilized a film containing an oxidant which supported combustion. Still a pyrotechnic package was needed to ignite the film with this oxidant therein. All of these known devices had the disadvantages of providing only partial destruction and being bulky to position in a container of electronic circuit modules.

SUMMARY OF THE INVENTION

In the present invention a single circuit destruct film consisting of tungstic oxide and aluminum are vacuum deposited simultaneously onto a glass or ceramic substrate either over or under a vacuum deposited thin film circuit which may be a resistance film. This destruct film combination provides a single film that is electrically conductive and accordingly an electrical insulating film is vacuum deposited between the thin film circuit and the destruct film. Although there are many methods of depositing thin films, such as by cathode sputtering, triode sputtering, or electron beam deposition, the vacuum deposition by evaporation of the materials is preferable. The tungstic oxide used is a powder of 99.9 percent purity and the aluminim used is in wire form of 99.99 percent purity. The tungstic oxide is evaporated from a heated boat within an evacuated chamber for this purpose and the aluminum wire is evaporated in this chamber simultaneously from a helical tungsten filament. The substrate is likewise heated in the chamber and the two films are intermingled as a single film to the desired thickness. The thin film circuit is likewise evaporated on the substrate through a mask laying out the circuit. The electrical insulating film is also vacuum deposited onto the substrate which may be a silicon monoxide material. The thin film circuit and the silicon monoxide film are separately deposited to provide distinct separate films as well as separate gold-chromium terminal pads for making electrical connections to the thin film circuit and to the destruct film. Accordingly, it is a general object of this invention to provide a single thin film layer of tungstic oxide and aluminum materials which, when suitably ignited, destroy themselves and destroy other films deposited thereover or therunder to avoid enemy compromise.

BRIEF DESCRIPTION OF THE DRAWING

These and other objects and the attendant advantages, features, and uses will become more apparent to those skilled in the art as a more detailed description proceeds when considered along with the accompanying drawing, in which.

DESCRIPTION OF THE PREFERRED EMBODIMENT

Figure 1:
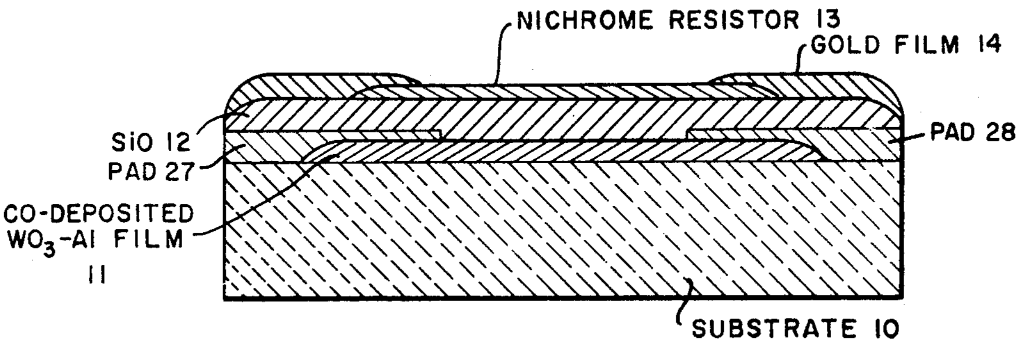
FIG. 1 is a cross-sectional view of a thin film circuit module having the destruct film on the substrate underlying the thin film circuit.

Referring more particularly to FIG. 1 there is illustrated a circuit module supported by a glass, ceramic, or other suitable material substrate 10. Vacuum deposited simultaneously on the substrate 10 are the powder material tungstic oxide ($WO_3$) and the metal aluminum (Al) to a thickness of approximately 2,200 angstroms (A) to produce a destruct film 11. An electrical insulating film of silicon monoxide (SiO) 12 is vaccum deposited on top of the destruct film 11. Any thin film circuit structure is then vacuum deposited on top of the insulator film 12, such as the resistance film of nichrome 13. A gold or gold-chromium film 14 may be vacuum deposited on the outer edges of the nichrome film 13 to provide connector pads for the thin film circuit. The destruct film 11 also has terminals situated in any suitable manner (not shown) for connection to the power source in FIG. 2.

Figure 2:
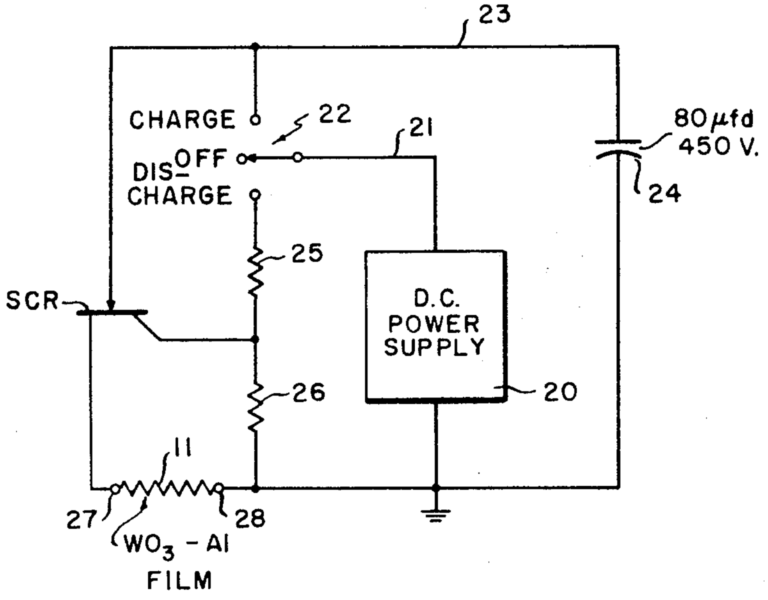
FIG. 2 is a circuit diagram, partly in block, of the ignition circuit for the destruct film.

Referring more particularly to FIG. 2 there is illustrated in block and circuit diagram a power source for activating the destruct film 11. A direct current (D.C.) power supply 20 has one terminal 21 connected to the switch blade of a three position switch 22 and the other terminal connected to a fixed potential, such as ground. The upper switch 22 contact "Charge" is connected by the conductor 23 to the upper plate of a capacitor 24 and also to the anode of a silicon controlled rectifier (SCR). The lower plate of the capacitor 24 is connected to the fixed potential or ground. The mid position of switch 22 is "off" while the lower position "Discharge" is coupled in series through resistors 25 and 26 to the ground terminal. The junction of the resistors 25 and 26 is connected to the gate terminal of the SCR. The cathode of the SCR is coupled to one terminal 27 of the destruct film 11, the opposite terminal 28 of film 11 being coupled to the fixed or ground potential. The output terminals provide a voltage pulse or source of current to the destruct film to ignite same as will be made clear in the description of operation to follow.

OPERATION

In the operation of the anticompromise circuit it is to be assumed that the destruct film 11 of the module illustrated in FIG. 1, or more practically a bank of such modules in equipment circuits, are coupled in parallel to the terminals 27 and 28 of the ignition circuit of FIG. 2. The switch 22 is switched to the "Charge" contact to charge capacitor 24 to 200–400 volts, the capacitor 24 being shown in FIG. 2 as having a value of 80 microfarads for the purpose of an operative example. When it is desired to destroy the thin film circuitry, the switch 22 is positioned at "Discharge" which applies the D. C. voltage to the gate terminal of the SCR thereby making the SCR conductive to apply the full charge on the capacitor 24 across the destruct circuit 11. This produces ignition of the destruct film by conduction and heat produced by the aluminum and by the support of combustion from the tungstic oxide to destroy the destruct film and with it the thin film circuit by violent thermite reaction. In this manner a piece of electronic equipment can be destroyed beyond recognition, repair, or use by enemy forces using only approximately 4 joules of energy.

While similar or equivalent methods and means may readily suggest themselves from this description, we intend to be limited in the spirit of our invention only by the scope of the appended claims.

We claim:

1. An anticompromise circuit having a single self-destruct thermite material thin film thereon comprising:

an electrical insulating substrate;

a single destruct thin film of simultaneously vacuum deposited tungstic oxide and aluminum on said substrate;

a thin film of electrical insulation material vacuum deposited over said single destruct thin film except for terminal points;

a thin film circuit vacuum deposited on said electrical insulation thin film over said destruct thin film; and terminal pads vacuum deposited to said terminal points and to portions of said thin film circuit, said destruct terminal pads adapted to be coupled to a pulsed current to produce thermite destruction of said thin film circuit, said electrical insulating film, and said destruct film to avoid circuit compromise.

* * * * *